(12) United States Patent
Gerlach et al.

(10) Patent No.: US 8,467,428 B2
(45) Date of Patent: Jun. 18, 2013

(54) VERTICAL CAVITY SURFACE EMITTING LASER DEVICE WITH MONOLITHICALLY INTEGRATED PHOTODIODE

(75) Inventors: Philipp Henning Gerlach, Blaustein (DE); Roger King, Ulm (DE); Marcel Franz Christian Schemmann, Maria Hoop (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 253 days.

(21) Appl. No.: 12/990,798

(22) PCT Filed: May 4, 2009

(86) PCT No.: PCT/IB2009/051813
§ 371 (c)(1),
(2), (4) Date: Nov. 3, 2010

(87) PCT Pub. No.: WO2009/136348
PCT Pub. Date: Nov. 12, 2009

(65) Prior Publication Data
US 2011/0064110 A1    Mar. 17, 2011

(30) Foreign Application Priority Data
May 9, 2008   (EP) .................................... 08103882

(51) Int. Cl.
*H01S 5/00*    (2006.01)

(52) U.S. Cl.
USPC .................................. 372/50.21; 372/50.124

(58) Field of Classification Search
USPC .......................................... 372/50.124, 50.21
See application file for complete search history.

(56) References Cited

U.S. PATENT DOCUMENTS

| | | | |
|---|---|---|---|
| 5,577,064 A * | 11/1996 | Swirhun et al. | 372/96 |
| 5,606,572 A | 2/1997 | Swirhun et al. | |
| 6,023,485 A | 2/2000 | Claisse et al. | |
| 7,277,463 B2 | 10/2007 | Guenter et al. | |
| 2003/0021322 A1 | 1/2003 | Steinle et al. | |
| 2005/0041714 A1 | 2/2005 | Kim | |
| 2005/0094695 A1 | 5/2005 | Trezza et al. | |
| 2005/0286595 A1 | 12/2005 | Guenter et al. | |
| 2007/0015298 A1 | 1/2007 | Onishi et al. | |

FOREIGN PATENT DOCUMENTS
EP   0993087 A1   4/2000

* cited by examiner

*Primary Examiner* — Armando Rodriguez

(57) ABSTRACT

The present invention relates to a vertical cavity surface emitting laser device comprising a VCSEL with a monolithically integrated photodiode. The photodiode (2) is formed of a layer sequence of a first n-doped region (6), a p-doped region (7), an intrinsic region (8) and a second n-doped region (9) of a semiconductor material. The photodiode (2) and the laser share a common electrode, which is realized as an Ohmic n-contact (10) at said first n-doped region (6). The proposed device allows less complex manufacturing, resulting in lower manufacturing costs.

12 Claims, 2 Drawing Sheets

VERTICAL CAVITY SURFACE EMITTING LASER DEVICE WITH MONOLITHICALLY INTEGRATED PHOTODIODE

FIELD OF THE INVENTION

The present invention relates to a vertical cavity surface emitting laser device comprising a vertical cavity surface emitting laser with a monolithically integrated photodiode arranged to measure the intensity of light emitted by said laser. The invention further relates to an optical sensor module for measuring distances and/or movements including such a vertical cavity surface emitting laser device.

BACKGROUND OF THE INVENTION

Vertical (extended) cavity surface emitting lasers (VCSEL/VECSEL) integrated with photodiodes are attractive devices for optical sensors based on self-mixing interference (SFI). These VCSEL integrated photodiodes (VIP) are the key component for the Twin-eye™ sensor from Philips Laser Sensors. In a further application of a VCSEL with integrated photodiode, the signal of the photodiode is used as a feedback signal for controlling or stabilizing the output power of the VCSEL.

Known designs of VCSEL devices with integrated photodiodes comprise an epitaxial layer stack forming the photodiode, which is arranged at the bottom of the VCSEL structure and is separated by a spacer layer from the bottom DBR (DBR: Distributed Bragg Reflector) of the VCSEL. In another design, the photodiode is integrated in the bottom DBR of the VCSEL. The latter design is disclosed for example in US 2003/0021322 A1, which describes a photodiode formed of an n-doped region, an intrinsic region and a p-doped region, which are integrated in the bottom DBR of the VCSEL. To this end, the bottom DBR is separated into a first, n-doped portion and a second, p-doped portion. The second p-doped portion forms the p-doped region of the photodiode, whereas the intrinsic region and the n-doped region are arranged between the two portions of the DBR. The VCSEL and the photodiode share a common electrode realized as an Ohmic n-contact at the n-doped region of the photodiode, which forms a spacer layer required in this design within the bottom DBR.

Although the photodiodes can be monolithically integrated with the VCSEL as shown above, the production costs are significantly higher than those of standard VCSELs. This is due to the required epitaxial layer stack which is much thicker for VCSELs with integrated photodiodes than in the case of simple VCSELs. Furthermore, in designs in which the p-doped region of the photodiode has to be electrically contacted, special fabrication steps are needed to provide an Ohmic contact to the p-doped layer of the integrated photodiode. The first drawback also applies to the device of US 2003/0021322, which requires a thick n-doped spacer layer within the bottom DBR. Such a thick spacer layer is undesirable because it increases the reactor growth time during fabrication and is almost as expensive as the simple mounting of a photodetector at the bottom side of the VCSEL instead of monolithically integrating the photodiode. The spacer layer also requires accurate thickness control during fabrication, such that mirror reflectivity and phase of the upper and lower portion of the bottom DBR match.

SUMMARY OF THE INVENTION

It is an object of the present invention to provide a vertical cavity surface emitting laser with monolithically integrated photodiode, which allows less complex fabrication in conjunction with a reduced thickness of the epitaxial layer stack compared with the prior art solutions.

The object is achieved with the vertical cavity surface emitting laser device and the optical sensor module according to claims 1, 2 and 15. Advantageous embodiments of the vertical surface emitting laser device are subject matter of the dependent claims or are described in the subsequent portions of the description and preferred embodiments.

The proposed vertical cavity surface emitting laser device comprises a vertical cavity surface emitting laser with a monolithically integrated photodiode arranged to measure the intensity of light emitted by said laser. The photodiode is formed of a layer sequence of a first n-doped region, a p-doped region, an intrinsic region and a second n-doped region of a semiconductor material. The photodiode and the laser share a common electrode which is realized as an Ohmic n-contact at said first n-doped region. Such a device can be fabricated on an n-doped substrate. An alternative solution is a device which is fabricated on a p-doped substrate. In this case, all dopings mentioned above and in the following description have to be inversed, i.e. n instead of p and p instead of n.

The term "vertical cavity surface emitting laser" in this patent application also includes so-called vertical external cavity surface emitting lasers (VECSEL). In the following, only for simplification the abbreviation VCSEL is used for both types of lasers.

With the use of a photodiode based on an epitaxial layer stack of n-p-i-n-doped semiconductor material, the design of the proposed device allows the use of a common electrode for the VCSEL cathode and the photodiode anode, realized as an Ohmic n-contact at the first n-doped region of the photodiode. Therefore, there is only one p-contact required for the electrical contacting of the device, thereby reducing the production complexity. Since the additional (first) n-doped layer of the photodiode is not required to fulfill the function of a thick spacer layer, the epitaxial layer stack forming the whole device can be manufactured thinner than the layer stacks of the prior art. All this results in a reduction of production costs and production time as well as production complexity compared to the prior art solutions.

The photodiode of the proposed device can be integrated in one of the DBRs of the VCSEL or formed as a continuation of the layer structure of the VCSEL. In the latter design, in which the VCSEL comprises a first layer structure including an active region being embedded between a p-doped DBR and a n-doped DBR, the photodiode is formed as a continuation of this first layer structure, such that the first n-doped region of the photodiode faces the n-doped DBR of the VCSEL.

Optimum results are achieved with a laser design in which the laser threshold current is less than 30% of the laser operating current. Furthermore, the bias of the photodiode should be chosen appropriately, for example at least about 0.4 V, depending on the design of the photodiode. The photodiode should be designed such that at low bias, e.g. 0.4 V, the intrinsic region is completely depleted or at least depleted sufficiently such that the detector capacitance is low enough and the detector responsivity is high enough for the desired operation.

The VCSEL of the proposed device has a design as known in the art with two layer structures embedding the active region and forming the two end mirrors of the laser cavity. These end mirrors are preferably distributed Bragg reflectors (DBR). The active region on the other hand is formed of a quantum-well structure. The VCSEL may be designed as a top or a bottom emitter.

When forming the layers of the photodiode as bulk layers, these bulk layers have a thickness of approximately 2 μm. Based on a typical growth rate for molecular beam epitaxy (MBE) of 500 nm/h, this means that it takes the MBI system more than one working day to form only those bulk layers. In order to reduce this manufacturing time, in an advantageous embodiment of the proposed device, the photodiode is based on thinner layers, preferably ≦500 nm thick, which are integrated in one of the DBRs of the VCSEL. In one of the embodiments such a photodiode is formed of a quantum-well structure. Quantum-wells are only a few nanometers thick and can easily be included in the epitaxial growth of the vertical cavity laser emission device. The same applies to the above thin layers. This will significantly reduce the time required for epitaxial growth of such a device.

Since thinner layers have less absorption than thick bulk material, the proposed photodiode having such thinner layers or quantum-wells is integrated in one of the DBRs of the VCSEL. The VCSEL in this case comprises a first layer structure including the active region being embedded between a first DBR and a second DBR, wherein the first n-doped region, the p-doped region, the intrinsic region and the second n-doped region of the photodiode are integrated in the second DBR. To this end, the second DBR may be formed of three portions, a first n-doped portion adjacent to the active region, a second p-doped portion and a third n-doped portion. The first n-doped region of the photodiode is then formed of the first n-doped portion of the second DBR. The p-doped region of the photodiode is formed of the second p-doped portion of the second DBR and the second n-doped region of the photodiode is formed of the third n-doped portion of the second DBR. The intrinsic region of the photodiode forming the absorbing layer is arranged between the second and the third portion of the second DBR. This second DBR may for example be the bottom DBR of a top emitting VCSEL. In order to integrate the above regions in the second DBR, the corresponding thin layers of this DBR must be adapted in their doping concentrations and material compositions in order to fulfill the function needed to form the photodiode. For example, in the case of a VCSEL emitting at 850 nm, the DBRs may be formed of layers of $Al_xGa_{1-x}As$, wherein x is chosen to achieve the desired high reflectivity. Without an integrated photodiode, the amount of Al is set higher than a minimum value in order to avoid light absorption in the layers. When integrating the photodiode, however, the amount of Al in the absorbing layer of the photodiode is lowered in order to achieve the desired absorption.

In order to control the relation between spontaneous light and stimulated light, which are detected by the photodiode, the longitudinal position of the absorbing quantum-well of the photodiode, i.e. of the intrinsic region, is carefully selected, preferably, to be in or close to the maximum of the standing wave pattern of the laser radiation in the laser cavity. The photodiode then much better detects stimulated emission compared to spontaneous emission.

As a further preferred measure to control or reduce the amount of spontaneous emission detected by the photodiode, one or more carefully doped quantum-wells or other thin doped layers are arranged between the intrinsic region and the p-doped region of the photodiode in order to create a spectral filter, preferably integrated in the p-doped portion of the second DBR. This spectral filter is designed to block or reduce the passage of spontaneous emission outside of the wavelength region of the stimulated emission, so that less spontaneous emission reaches the intrinsic region of the photodiode.

The proposed optical module comprises at least one such vertical cavity emitting laser device emitting a measuring beam which, when reflected by an object, re-enters the laser cavity and generates a self-mixing effect which is measured by the photodiode. Such an optical measuring module for measuring distances and/or movements also includes or is connected with appropriate signal processing circuitry which calculates the distance and/or movement based on the measuring signal of the photodiode. Such an optical module may be embedded in an input device or in an apparatus having such an input device included. Apparatuses wherein the input device can be used are for example a mouse for a desktop computer, a notebook computer, a mobile phone, a personal digital assistant (PDA) and a handheld game computer. The module can also be used in professional measuring apparatuses for measuring, for example, distance to an object or movement of the object, movement of a liquid and movement of particles embedded in a liquid. Generally, the invention may be used in any applications where the laser self-mixing effect can be used.

These and other aspects of the invention will be apparent from and elucidated with reference to the embodiments described hereinafter.

BRIEF DESCRIPTION OF THE DRAWINGS

The proposed vertical cavity surface emitting laser device is described in the following by way of examples and with reference to the accompanying Figures, without limiting the scope of protection as defined by the claims. The Figures show:

DETAILED DESCRIPTION OF EMBODIMENTS

Figure 1:
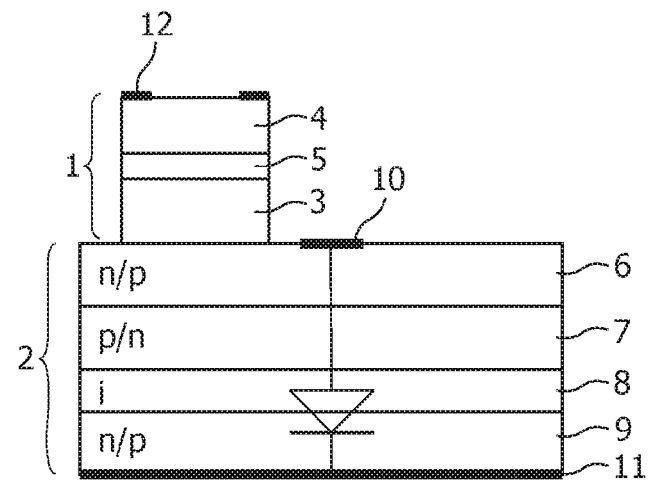
FIG. 1 a schematic view of a first embodiment of the proposed device.
Figure 2:
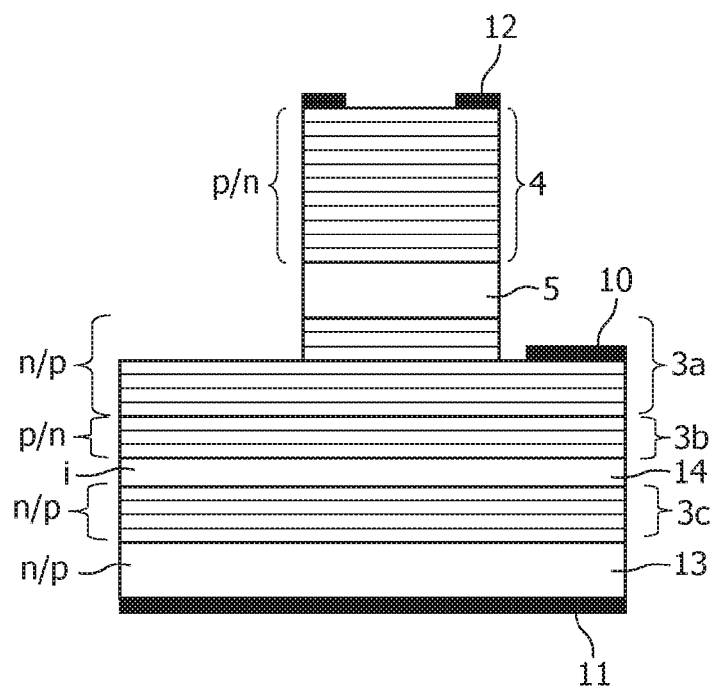
FIG. 2 a schematic view of a second embodiment of the proposed device.
Figure 3:
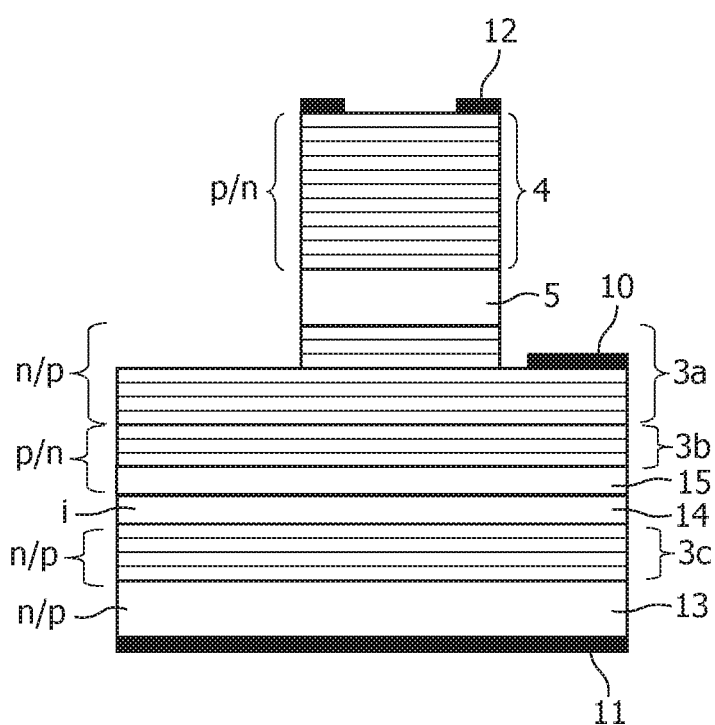
FIG. 3 a schematic view of a third embodiment of the proposed device.

The following discussions of FIGS. 1-3 primarily address embodiments in which a device is fabricated on an n-doped substrate. Alternative embodiments relate to a device which is fabricated on a p-doped substrate; in which, all dopings as described below with respect to FIGS. 1-3 are inversed (i.e., n instead of p and p instead of n). This is illustrated in each of FIGS. 1-3 by the designation "x/y" where the "x" component designates the doping as described below with respect to FIGS. 1-3 and the "y" component designates the alternative doping situation in which a p-doped substrate is utilized.

FIG. 1 is a schematic view of an exemplary design of the proposed device. The Figure shows a VCSEL structure 1 arranged on top of a layer sequence forming a photodiode 2. The top emitting VCSEL comprises a layer structure including an active region 5 embedded between a lower DBR 3 and an upper DBR 4. The upper DBR 4 is p-doped, the lower DBR 3 is n-doped. In such a top emitting VCSEL, the upper DBR is formed so as to be partly transmissive, for example with a reflectivity of 98% for the laser radiation generated in the active region 5, enabling it to work as an outcoupling mirror. The upper and lower DBRs are typically composed of alternating high and low refractive index GaAs (high index) and AlAs (low index) layers. The GaAs layers have a low Al %, in the following referred to as $Al_xGa_{1-x}As$ layers, such that the material band gap is above the photon energy. The lower DBR is designed so as to be highly reflective for the generated laser radiation, for example with a reflectivity of 99%. Nevertheless, a small portion of the laser radiation also passes the lower DBR and can be detected in the photodiode 2 arranged on this bottom side of the VCSEL.

The photodiode 2 is formed of a layer sequence of an upper n-doped $Al_xGa_{1-x}As$ layer 6, a p-doped $Al_xGa_{1-x}As$ layer 7, an intrinsic $Al_xGa_{1-x}As$ layer 8 and a bottom n-doped $Al_xGa_{1-x}As$ layer 9. This design has the advantage that the cathode of the VCSEL and the anode of the photodiode 2 can share a common electrode, which is realized as an Ohmic n-contact 10 on top of the upper n-doped $Al_xGa_{1-x}As$ layer 6 of the photodiode. A further Ohmic n-contact 11 which forms the cathode of the photodiode is arranged on the bottom portion of the bottom n-doped $Al_xGa_{1-x}As$ layer 9 of the photodiode. The further required Ohmic p-contact 12 is arranged on top of the layer structure 1 forming the VCSEL as known in the art. Therefore, only one p-contact is required for the device, which helps to reduce the production complexity. The different layers of the photodiode may have the following thicknesses and doping concentrations, for example:

upper n-doped $Al_xGa_{1-x}As$ layer 6: thickness of approx. 2 μm; doping: $4.2*10^{18}$ (1/cm$^3$)

p-doped $Al_xGa_{1-x}As$ layer 7: thickness of approx. 2 μm; doping: $2.0*10^{19}$ (1/cm$^3$)

intrinsic $Al_xGa_{1-x}As$ layer 8: thickness of approx. 2 μm; no doping lower n-doped $Al_xGa_{1-x}As$ layer 9: thickness of approx. 650 μm forming the substrate; doping: $3.1*10^{18}$ (1/cm$^3$).

The Ohmic contacts are preferably made of Ti/Pt/Au for the p-contact and Ge/Au/Ni/Au for the n-contacts. The above discussion of FIG. 1 relates to an embodiment in which an n-doped substrate is employed. In an alternative embodiment of FIG. 1 (and FIGS. 2 and 3) where a p-doped substrate is utilized, items 10 and 11 would be Ohmic p-contacts, while item 12 would be an Ohmic n-contact.

FIG. 2 shows a further example of the proposed device in which the photodiode is formed of a quantum-well structure. In this example, the photodiode is integrated in the bottom DBR 3a-3c of the VCSEL. The top DBR 4 and the active region as well as the Ohmic p-contact 12 forming the VCSEL anode are designed in a conventional manner. The bottom DBR 3 is separated into three portions. The upper portion 3a is n-doped, an intermediate portion 3b is p-doped and a bottom portion 3c is n-doped. Between the intermediate portion 3b and the bottom portion 3c an absorbing quantum-well structure 14 is arranged forming the intrinsic region of the photodiode. With this design, the upper n-doped region, the p-doped region and the lower n-doped region of the n-p-i-n photodiode of the proposed device is formed by the layers of the bottom DBR. The upper n-doped region is formed by the upper n-doped portion 3a of the bottom DBR. The p-doped region is formed by the intermediate p-doped portion of the bottom DBR and the lower n-doped region of the photodiode is formed by the n-doped bottom portion 3c of the bottom DBR. Except for the absorbing quantum-well structure 14, no additional layers have been added to the lower DBR 3 of this structure in order to set up the photodiode. This means that the epitaxial layer stack forming the device is approximately as thick as for standard VCSELs. There is no need to grow 6 μm or more of bulk material for the photodiode. This reduces the manufacturing time and costs. The Ohmic n-contact forming the cathode of the VCSEL and at the same time the anode of the photodiode is arranged at the upper n-doped portion 3a of the lower DBR 3 which at the same time represents the upper n-doped region of the photodiode. The whole layer structure is grown on an n-doped substrate 13 to which at the bottom side the Ohmic n-contact for the cathode of the photodiode is attached.

FIG. 3 shows a further example of the proposed device, which is constructed similarly to the device of FIG. 2. The only difference is an additional quantum-well or quantum-well structure 15 which is formed in the p-doped portion of the bottom DBR 3, i.e. in the intermediate portion 3b of this bottom DBR. This additional quantum-well structure 15 on top of the absorbing quantum-well structure 14 is designed to filter light propagating from the active region 5 towards the intrinsic region of the photodiode, such that stimulated emission of the laser can pass and spontaneous emission in wavelength ranges outside of the wavelength range of the stimulated emission is strongly reduced. With this additional filter quantum-well structure 15, which is doped to avoid re-emission of absorbed light, the amount of spontaneous emission that is detected by the absorbing quantum-well 14 is reduced.

While the invention has been illustrated and described in detail in the drawings and the foregoing description, such illustration and description are to be considered illustrative or exemplary and not restrictive; the invention is not limited to the disclosed embodiments. The different embodiments described above and in the claims can also be combined. Other variations to the disclosed embodiments can be understood and effected by those skilled in the art in practicing the claimed invention, from a study of the drawings, the disclosure and the appended claims. For example, the VCSEL used can also be composed of other material layers or may be a bottom emitting laser as known in the art. Furthermore, the semiconductor laser may also be designed as a vertical extended cavity surface emitting laser (VECSEL). The number of layers in the layer stacks is not limited by the present invention. This number can be selected appropriately for the required optical properties of the layer stack.

In the claims, the word "comprising" does not exclude other elements or steps, and the indefinite article "a" or "an" does not exclude a plurality. The mere fact that measures are recited in mutually different dependent claims does not indicate that a combination of these measures cannot be used to advantage. The reference signs in the claims should not be construed as limiting the scope of these claims.

List Of Reference Signs
1 layer structure of VCSEL
2 layer sequence of photodiode
3 lower DBR
3a top portion of bottom DBR
3b intermediate portion of bottom DBR
3c bottom portion of bottom DBR
4 upper DBR
5 active region
6 upper n-doped $Al_xGa_{1-x}As$ layer
7 p-doped $Al_xGa_{1-x}As$ layer
8 intrinsic $Al_xGa_{1-x}As$ layer
9 lower n-doped $Al_xGa_{1-x}As$ layer
10 Ohmic n-contact
11 Ohmic n-contact
12 Ohmic p-contact
13 n-doped substrate
14 absorbing quantum-well
15 filter quantum-well

The invention claimed is:

1. A vertical cavity surface emitting laser device, comprising a vertical cavity surface emitting laser (1) with a monolithically integrated photodiode (2) arranged to measure an intensity of light emitted by said laser (1), wherein said photodiode (2) is formed of a layer sequence of a first n-doped region (6), a p-doped region (7), an intrinsic region (8, 14) and a second n-doped region (9) of a semiconductor material, said photodiode (2) and said laser (1) sharing a common electrode, which is realized as an Ohmic n-contact (10) at said first n-doped region (6), and a first layer structure including an active region being embedded between a first DBR and a second DBR, said first n-doped region, said p-doped region, said intrinsic region and said second n-doped region of said photodiode being integrated in said second DBR, wherein said first n-doped region of said photodiode is formed of a first n-doped portion of said second DBR, said p-doped region of said photodiode is formed of a second p-doped portion (3b) of said second DBR and said second n-doped region of said photodiode is formed of a third p-doped portion of said second DBR, said intrinsic region of said photodiode being arranged between said second and third portion (3c) of said second DBR.

2. A vertical cavity surface emitting laser device, comprising a vertical cavity surface emitting laser (1) with a monolithically integrated photodiode (2) arranged to measure an intensity of light emitted by said laser (1), wherein said photodiode (2) is formed of a layer sequence of a first p-doped region, an n-doped region, an intrinsic region and a second p-doped region of a semiconductor material, said photodiode (2) and said laser (1) sharing a common electrode, which is realized as an Ohmic p-contact at said first p-doped region, and a first layer structure including an active region being embedded between a first DBR and a second DBR, said first p-doped region, said n-doped region, said intrinsic region and said second p-doped region of said photodiode being integrated in said second DBR, wherein said first p-doped region of said photodiode is formed of a first p-doped portion of said second DBR, said n-doped region of said photodiode is formed of a second n-doped portion of said second DBR and said second p-doped region of said photodiode is formed of a third n-doped portion of said second DBR, said intrinsic region of said photodiode being arranged between said second and third portion of said second DBR.

3. The laser device according to claim 1, wherein said common electrode forms a cathode of the laser (1) and an anode of the photodiode (2).

4. The laser device according to claim 2, wherein said common electrode forms an anode of the laser (1) and a cathode of the photodiode (2).

5. The laser device according to claim 1, wherein a spectral filtering layer (15) is formed between said intrinsic region (14) and said p-doped region (7), said filtering layer (15) being designed to reduce an amount of spontaneously emitted light which can propagate to the intrinsic region (14).

6. The laser device according to claim 2, wherein a spectral filtering layer is formed between said intrinsic region and said n-doped region, said filtering layer being designed to reduce an amount of spontaneously emitted light which can propagate to the intrinsic region.

7. The laser device according to claim 1, wherein said photodiode (2) is formed of quantum-well structures.

8. The laser device according to claim 1, wherein said intrinsic region (14) is arranged at a position in which a standing wave pattern of light waves resonating in said laser (1) has a maximum.

9. Optical sensor module for measuring distances and/or movements, including at least one laser device according to claim 1 emitting a measuring beam which, when reflected by an object, re-enters the laser cavity and generates a self mixing effect which is measured by said photodiode (2).

10. The laser device according to claim 2, wherein said photodiode is formed of quantum-well structures.

11. The laser device according to claim 2, wherein said intrinsic region is arranged at a position in which a standing wave pattern of light waves resonating in said laser has a maximum.

12. Optical sensor module for measuring distances and/or movements, including at least one laser device according to claim 2 emitting a measuring beam which, when reflected by an object, re-enters the laser cavity and generates a self mixing effect which is measured by said photodiode.

* * * * *